United States Patent
Nishimura et al.

(12)

(10) Patent No.: US 7,893,411 B2
(45) Date of Patent: Feb. 22, 2011

(54) CHARGED-PARTICLE BEAM WRITING APPARATUS AND CHARGED-PARTICLE BEAM WRITING METHOD

(75) Inventors: Rieko Nishimura, Kanagawa (JP); Kiyoshi Hattori, Tokyo (JP)

(73) Assignee: NuFlare Technology, Inc., Numazu-shi (JP)

( * ) Notice: Subject to any disclaimer, the term of this patent is extended or adjusted under 35 U.S.C. 154(b) by 151 days.

(21) Appl. No.: 12/239,116

(22) Filed: Sep. 26, 2008

(65) Prior Publication Data

US 2009/0084990 A1    Apr. 2, 2009

(30) Foreign Application Priority Data

Sep. 28, 2007 (JP) ............................. 2007-255401

(51) Int. Cl.
*H01J 37/317*    (2006.01)
(52) U.S. Cl. ................................. 250/492.22
(58) Field of Classification Search ............ 250/492.22, 250/492.23, 396 R
See application file for complete search history.

(56) References Cited

U.S. PATENT DOCUMENTS 6,774,379 B2 * 8/2004 Hashimoto ............. 250/492.22
7,102,147 B2 * 9/2006 Inanami et al. ......... 250/492.23

FOREIGN PATENT DOCUMENTS

| JP | 8-250394 | 9/1996 |
| JP | 10-256122 | 9/1998 |
| JP | 10-284392 | 10/1998 |

* cited by examiner

*Primary Examiner*—Kiet T Nguyen
(74) *Attorney, Agent, or Firm*—Oblon, Spivak, McClelland, Maier & Neustadt, L.L.P.

(57) ABSTRACT

A timing control circuit controls the timing for applying a voltage to a sub deflector when changing a position to be irradiated with the charged-particle beam. A control computer compares a target line width and a line width of a pattern written with the timing for applying voltage to the sub deflector changed, and determines appropriate timing for applying voltage to the sub deflector from a timing range corresponding to a predetermined allowable range of the difference between the target line width and the line width of the written pattern. The control computer then controls the timing control circuit based on the determined timing.

9 Claims, 6 Drawing Sheets

CHARGED-PARTICLE BEAM WRITING APPARATUS AND CHARGED-PARTICLE BEAM WRITING METHOD

BACKGROUND OF THE INVENTION

1. Field of the Invention

The present invention relates to a charged-particle beam writing apparatus and a charged-particle writing method, and more particularly to a charged-particle beam writing apparatus and charged-particle beam writing method in which a charged-particle beam is deflected by a main deflector and a sub deflector, which are disposed on the optical path of the charged-particle beam, and a predetermined pattern is written onto a sample located on a stage.

2. Background Art

With increasing integration densities of semiconductor integrated circuits, patterns of LSI (large scale integration) tend to be miniaturized and complex. Due to the miniaturization and complexity, a pattern is written directly onto a sample by means of a charged-particle beam such as an electron beam in place of exposure of the sample to light. In this technique, however, the writing speed and throughput are low compared with those obtained in a one-shot exposure method. Thus, attempts have been made to improve the throughput using various techniques.

In one of the techniques, the number of exposures is reduced by using a variable shaped beam instead of an electron beam having a circular cross section. In another one of the techniques, the stage moves continuously, not in accordance with a step and repeat method. In still another one, an electron beam is deflected according to a vector scanning method.

The combination of the abovementioned techniques makes it possible to greatly improve the throughput. In the vector scanning method, however, the deflection angle of an electron beam to be directed to a subfield varies depending on the position of the subfield within a frame. Due to the variation, the accuracy of the shape, position and size of a writing pattern may be degraded. Japanese patent laid-open No. 284392/1998 (Hei 10-284392) discloses a method for detecting a variation (occurring depending on the position of a spot of an electron beam deflected by a main deflector) in sensitivity of a sub deflector before formation of a pattern and correcting the detected value for the formation of the pattern.

It is necessary that an electron beam be deflected at a high speed and with high accuracy to improve the throughput. In order to drive a deflector by means of a deflection amplifier, however, a period of time (settling time) for settling an output voltage corresponding to a load for driving the deflector is required. In other words, a predetermined settling time is required to settle the output voltage in order to set the spot of a deflected electron beam to a target position. In addition, when the surface of a sample is irradiated with an electron beam during the settling time, a pattern written onto the sample is adversely affected. It is therefore necessary that a blanking mechanism be operated during the settling time to prevent the sample from being irradiated with the electron beam.

It is desirable that the time for starting an operation of a blanking mechanism (hereinafter referred to as the blanking start time) be identical to the timing for applying a voltage to a sub deflector when changing a position to be irradiated with the charged-particle beam. Thus, while the waveform of the output voltage is confirmed by an oscilloscope, the blanking start time is determined. In this method, however, there may occur adjustment errors on an individual basis. When the voltage is applied to the sub deflector before the blanking start time, an unnecessary region may be irradiated with the electron beam. Therefore, the accuracy of writing may be reduced. In a conventional technique, the voltage is applied to the sub deflector after a predetermined time elapses from the blanking start time.

The settling time is identical to a period of time for blanking. Thus, when the voltage is applied to the sub deflector after a predetermined time elapses from the blanking start time, the substantial settling time is reduced. This may result in the fact that formation of a pattern is started before output of the sub deflector is stabilized. Especially when the movement distance of the electron-beam irradiation position is large, the voltage to be applied to the sub deflector is large. It therefore takes a certain time to stabilize the output of the sub deflector. In this case, there is a higher possibility that formation of a pattern is started before the output of the sub deflector is stabilized. If the formation is started after the output of the sub deflector is stabilized, however, the settling time becomes longer, and the throughput is reduced.

SUMMARY OF THE INVENTION

It is, therefore, an object of the present invention to provide a charged-particle writing apparatus and charged-particle writing method, which are capable of suppressing a reduction in accuracy of writing and improving the throughput of the apparatus.

According to one aspect of the present invention, a charged-particle beam writing apparatus controls a charged-particle beam by means of a main deflector and a sub deflector which are provided on the optical path of the charged-particle beam, and controls a start time and termination time for irradiation with the charged-particle beam on a sample by means of a blanking deflector, to write a predetermined pattern onto the sample. The charged-particle beam writing apparatus comprises timing control means for controlling the timing for applying a voltage to the sub deflector with respect to the termination time for the irradiation with the charged-particle beam on the sample when changing a position to be irradiated with the charged-particle beam. And the charged-particle beam writing apparatus comprises a control computer for controlling the timing control means.

According to another aspect of the present invention, in a charged-particle beam writing method, a charged-particle beam is deflected by a main deflector and a sub deflector which are provided on the optical path of the charged-particle beam, and a predetermined pattern is written onto a sample placed on a stage. In the charged-particle beam writing method, a pattern is written with the timing of applying a voltage to the sub deflector changed with respect to a termination time for irradiation with the charged-particle beam. Appropriate timing for applying voltage to the sub deflector is determined from a timing range corresponding to a predetermined allowable range of the difference between the line width of the written pattern and a target line width when moving a position to be irradiated with the charged-particle beam.

Another object and an advantage of the present invention are apparent from the following description.

DETAILED DESCRIPTION OF THE PREFERRED EMBODIMENTS

Figure 1:
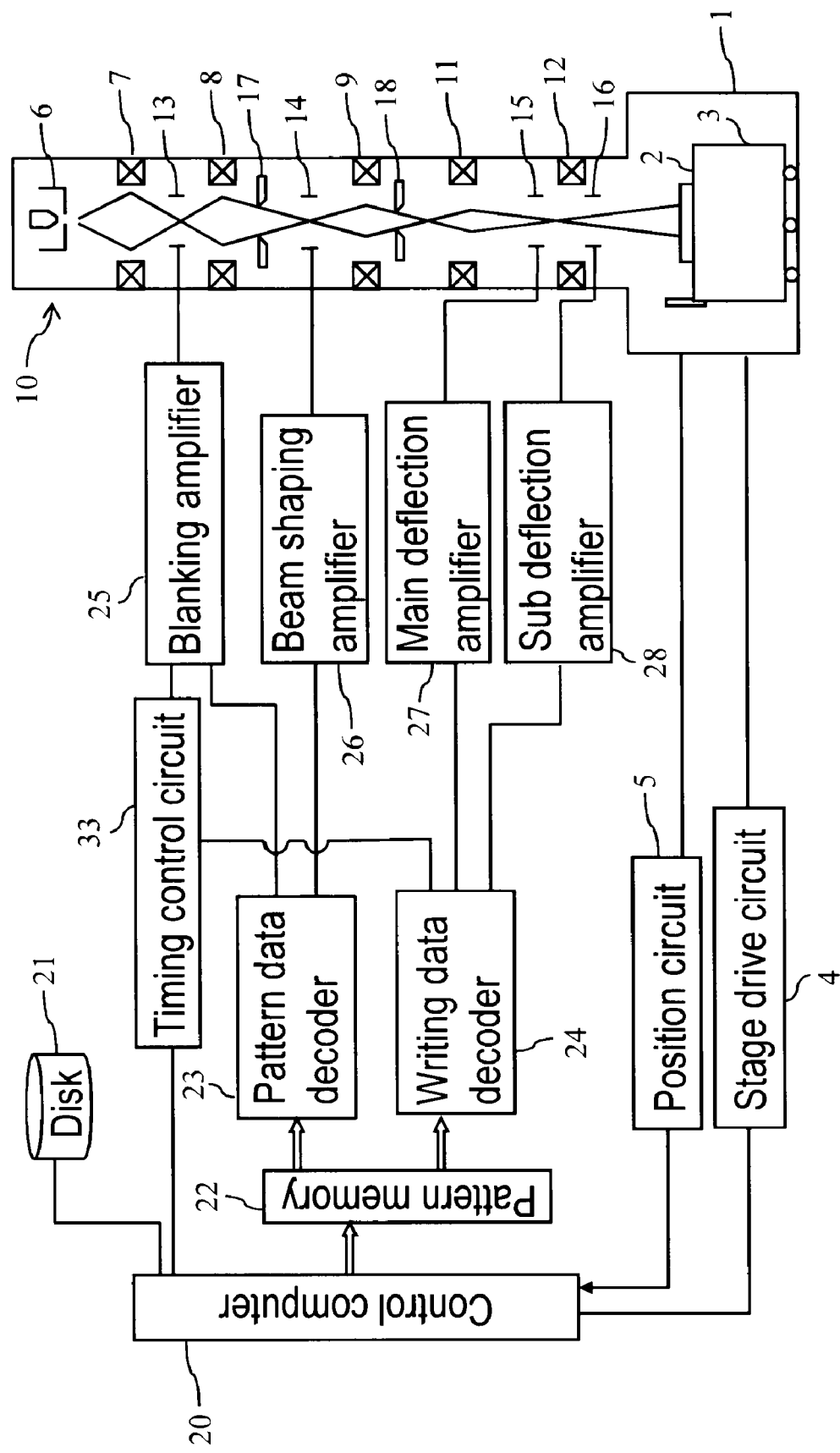
FIG. 1 is a diagram showing the configuration of an electron beam writing apparatus according to an embodiment of the present invention.

FIG. 1 is a diagram showing the configuration of an electron beam writing apparatus according to an embodiment of the present invention.

Referring to FIG. 1, a stage 3 is provided in a sample chamber 1, and a mask 2, a sample, is placed on the stage 3. The stage 3 is driven in an X direction (parallel to the horizontal direction of the sheet of FIG. 1) and a Y direction (perpendicular to the surface of the sheet of FIG. 1) by a stage drive circuit 4. The changed position of the stage 3 is measured by a position circuit 5 that uses a laser length measuring machine or the like.

An electron beam optical system 10 is arranged on the upper side of the sample chamber 1. The electron beam optical system 10 includes an electron gun 6, lenses 7, 8, 9, 11 and 12, a blanking deflector 13, a beam size changing deflector 14, a main deflector 15 for beam scanning, a sub deflector 16 for beam scanning, and beam shaping apertures 17 and 18. The main deflector 15 deflects an electron beam to ensure that the electron beam is directed to a predetermined subfield (sub deflection region). The sub deflector 16 deflects the electron beam to ensure that the electron beam is directed to a pattern present in the subfield. The beam size changing deflector 14 and the beam shaping apertures 17 and 18 serve to control the shape of the electron beam. The blanking deflector 13 serves to control irradiation of the surface of the mask 2 with the electron beam.

In the electron-beam writing, the stage 3 continuously moves in one direction, and one of rectangle frames (obtained by dividing a stripe region 29 shown in FIG. 2) is written based on the width of the spot of the electron beam deflected by the main deflector 15. After the formation of the frame, the stage 3 then moves in a direction perpendicular to the abovementioned direction, and another one of the rectangle frames is written. The frames are written by repeating the writing process.

Referring to FIG. 1, a magnetic disk 21 is connected to a control computer 20. Writing data on an LSI circuit is stored in the magnetic disk 21. The writing data read from the magnetic disk 21 is temporarily stored in a pattern memory 22 for each of the frames. The pattern data stored in the pattern memory 22 for each of the frames, i.e., frame information including graphic data and writing positions, is analyzed by a pattern data decoder 23 and a writing data decoder 24. The pattern data decoder 23 and the writing data decoder 24 constitute a data analyzer. After the analysis, the pattern data decoder 23 transmits the analyzed data to a blanking amplifier 25 and a beam shaping amplifier 26, and the writing data decoder 24 transmits the analyzed data to a main deflection amplifier 27 and a sub deflection amplifier 28.

The pattern data decoder 23 is adapted to receive the writing data and perform reversal processing on the graphic data included in the frame information when necessary in order to generate reversed pattern data. The pattern data decoder 23 then divides the graphic data defined as frame data into data pieces, each of which indicates a pattern that can be written by means of the combination of the beam shaping apertures 17 and 18. The pattern data decoder 23 then generates blanking data based on the obtained data, and transmits the generated blanking data to the blanking amplifier 25. In addition, the pattern data decoder 23 generates data (beam size data) of a desired beam size, and transmits the generated beam size data to the beam shaping amplifier 26. The beam shaping amplifier 26 receives the beam size data and transmits a predetermined deflection signal to the beam size changing deflector 14 included in the electron beam optical system 10. The beam size changing deflector 14 controls the size of the electron beam in response to the deflection signal.

The writing data decoder 24 generates data to be used to specify the position of a subfield based on the frame data and transmits the generated data to the main deflection amplifier 27. The main deflection amplifier 27 receives the data from the writing data decoder 24 and transmits a predetermined signal to the main deflector 15 included in the electron beam optical system 10. The main deflector 15 receives the signal from the writing data decoder 24 and deflects the electron beam to scan the specified subfield with the electron beam. In addition, the writing data decoder 24 generates a control signal to be used to cause the sub deflector 16 to perform scanning, and transmits the generated control signal to the sub deflection amplifier 28. The sub deflection amplifier 28 receives the control signal from the writing data decoder 24 and transmits a predetermined sub deflection signal to the sub deflector 16, whereby writing is performed on a subfield basis.

The sub deflector 16 shown in FIG. 1 controls the position irradiated with the electron beam at a high speed and with high accuracy. The electron beam deflected by the sub deflector 16 propagates only onto a specified subfield present on the mask 2. If the electron beam propagates onto a region other than the specified subfield, it is necessary that the position of the subfield be changed by the main deflector 15. As described above, the main deflector 15 is used to control the position of the subfield. The main deflector 15 is capable of changing the position of the subfield within the corresponding frame (main deflection region). Each of the frames is a region to be irradiated with the electron beam deflected by the main deflector 15. In addition, since the stage 3 continuously moves during writing, the main deflector 15 tracks the writing origin in the subfield in accordance with the movement of the stage 3.

Figure 2:
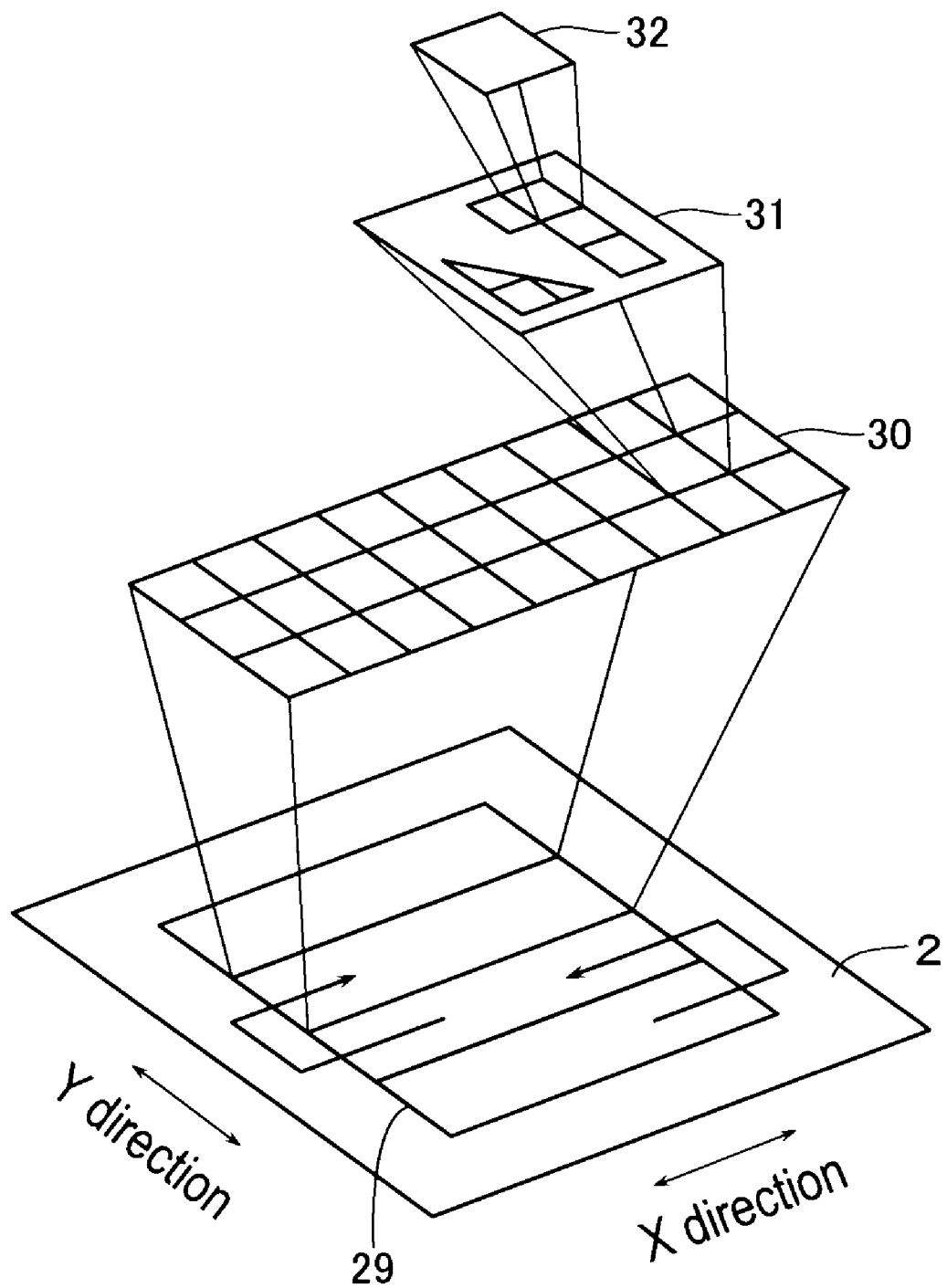
FIG. 2 is a diagram showing a writing process using an electron beam.

The electron beam shaped by the beam shaping apertures 17 and 18 is deflected by the main deflector 15 and the sub deflector 16 in the abovementioned way. While the stage 3 that continuously moves is tracked, a region to be irradiated with the electron beam can be determined. FIG. 2 is a diagram to explain the abovementioned operations. In FIG. 2, reference numeral 30 denotes a frame; 31, a subfield; and 32, a shot pattern. As shown in FIG. 2, while the stage 3 (not shown in FIG. 2) moves in the X direction, a stripe region 29 is written by means of the electron beam. The stage 3 then moves in the Y direction in a stepped manner, and the next stripe region 29 is written by means of the electron beam. These operations are repeated to form stripe regions on the entire surface of the sample. Furthermore, the period of writing time can be reduced by continuously moving the stage 3 in the X direction and irradiating a region (shot region) with the electron beam in accordance with the movement of the stage 3. In the present embodiment, the step-and-repeat writing method may be adopted in which writing is performed on one frame with the stage halted, and it is not performed during the movement of the stage to the next area.

Next, a description will be made of characteristics of the electron beam writing apparatus and electron beam writing method according to the present embodiment.

The blanking start time and the settling time will be described with reference to FIGS. 3A and 3B.

Figure 3:
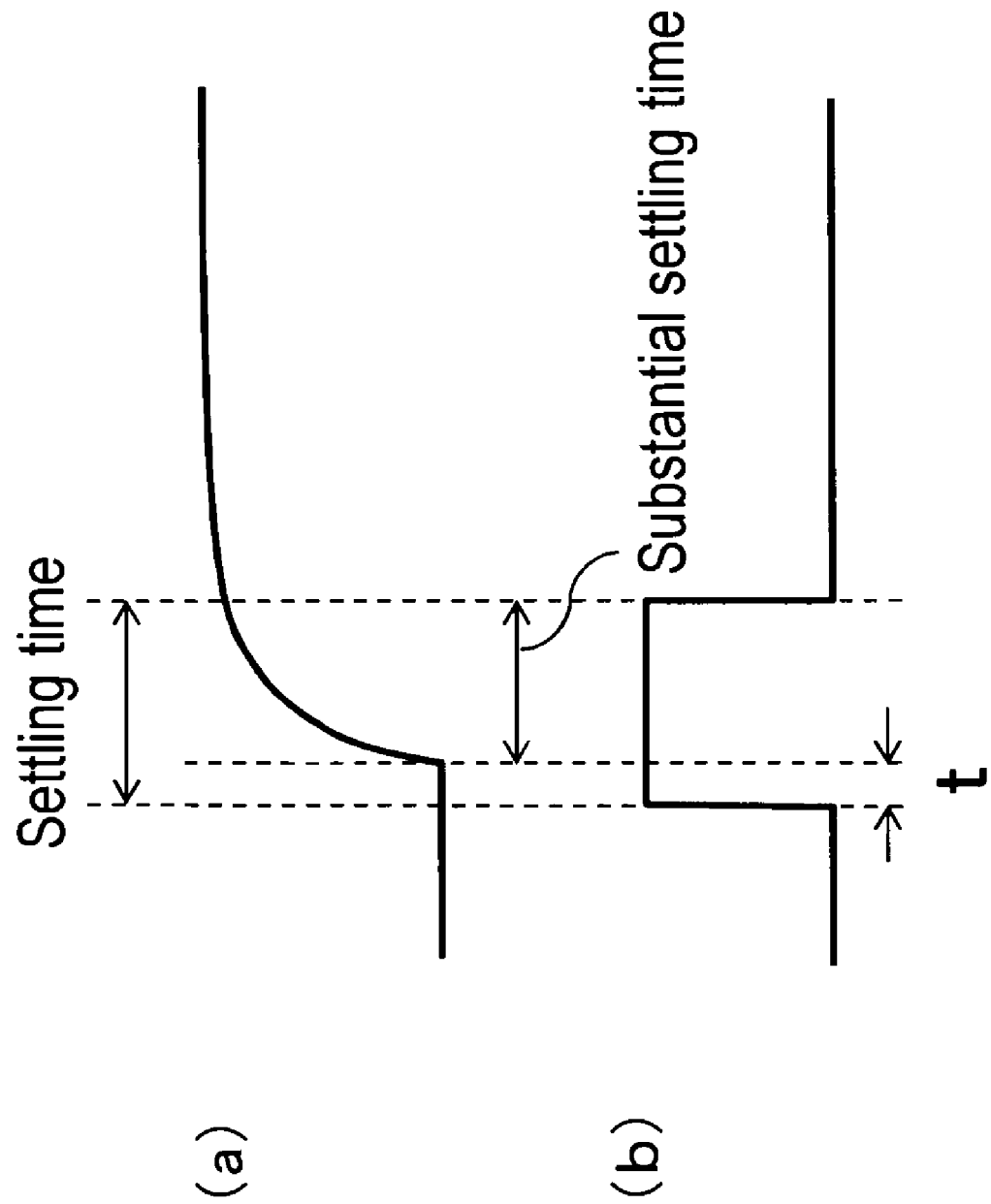
FIGS. 3A and 3B are diagrams showing the relationship between a blanking start time and a settling time.

FIG. 3A shows a waveform output from the sub deflection amplifier. FIG. 3B shows a waveform output from the blanking amplifier. When a voltage is applied to the sub deflector before the blanking is started, the electron beam may be drifted during the irradiation. This results in degradation in the writing accuracy. To avoid the degradation, a conventional technique provides a method for monitoring a voltage output from a sub deflection amplifier and a voltage output from a blanking amplifier and applying voltage to the sub deflector after a predetermined time (t: 10 nanoseconds in the present embodiment) elapses from the blanking start time. The settling time corresponds to a period of time during which a blanking control signal is input to the blanking deflector (i.e., a period of time during which an electron beam is not radiated). The start time of the settling time desirably matches the blanking termination time. There is a period of time t (shown in FIGS. 3A and 3B) between the start time of the settling time and the start time for applying voltage to the sub deflector. The substantial settling time is thus reduced by the period of time t. When writing is started before the output of the sub deflector is stabilized, therefore, the accuracy of writing is degraded.

In the conventional technique, the period of time t is set long enough to prevent voltage from being applied to the sub deflector before the blanking start time. If the period of time t can be reduced, a settable settling value can also be reduced. This leads to an improvement in the throughput without degradation in the accuracy of writing. The timing for applying voltage to the sub deflector desirably matches the blanking start time. However, even when the voltage is applied to the sub deflector before the blanking start time, no significant problem arises as long as the difference (hereinafter also called as shift amount) between the line width of the written pattern and a target line width is in an allowable range.

In the present embodiment, appropriate timing for applying voltage to the sub deflector is determined by changing the timing for applying voltage to the sub deflector and examining the relationship between the timing and the accuracy of writing. In addition, conditions for reducing the effective settling time and preventing degradation in the accuracy of the writing are efficiently detected.

The timing for applying voltage to the sub deflector is determined in the following manner.

Figure 4:
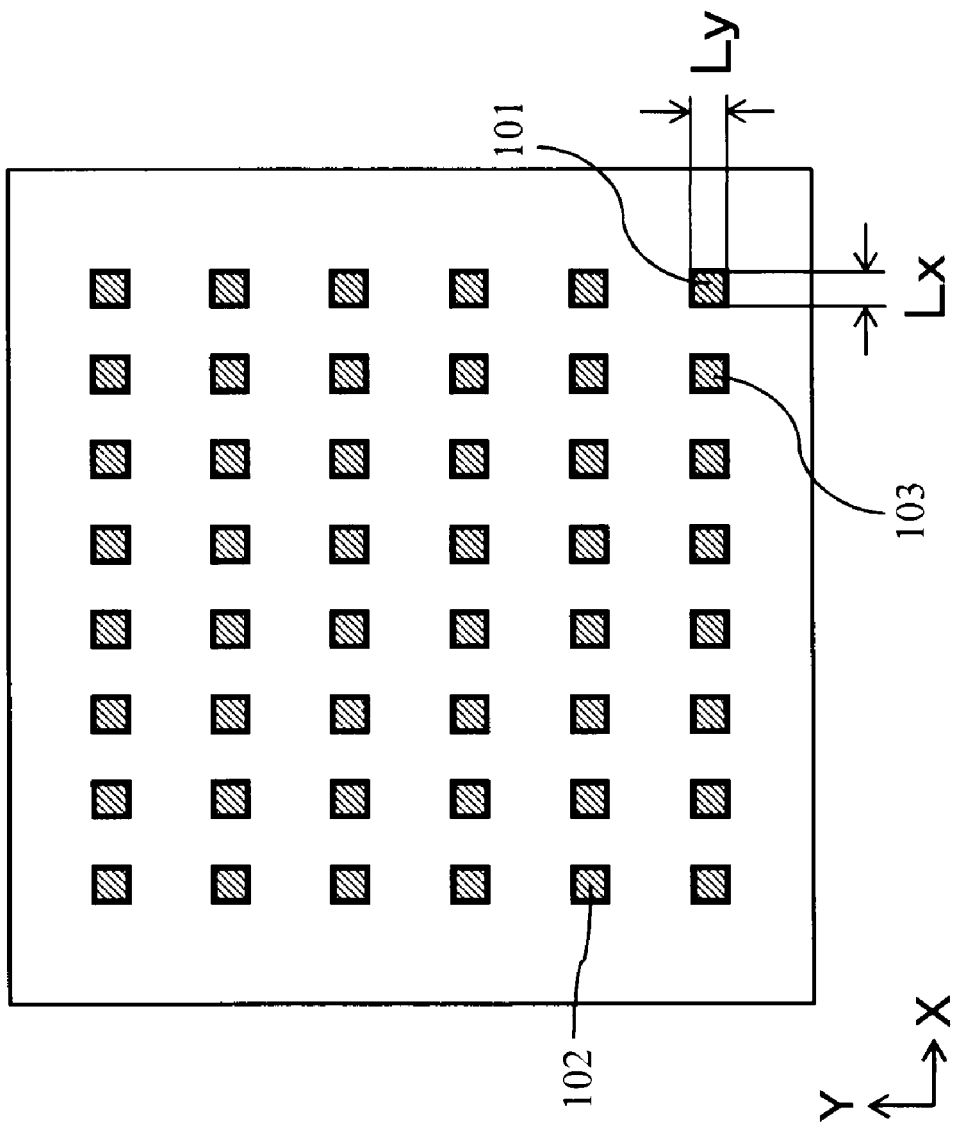
FIG. 4 is a diagram showing an example of a pattern written for evaluation according to the embodiment.

First, a pattern mask for evaluation is prepared. Then, the timing for applying voltage to the sub deflector is changed during writing to measure shifts in the line widths of written patterns. FIG. 4 shows an example of the evaluation patterns in which many contact holes are written in a single subfield. In this example, the patterns are written while the stage continuously moves in the X direction. After a pattern 101 located on the right edge of the subfield is written, the irradiation position moves from the pattern 101 to a pattern 102. The pattern 102 is then written in the same manner as the formation of the pattern 101. Since the movement distance of the irradiation position from the pattern 101 to the pattern 102 is larger than that from the pattern 101 to a pattern 103, the voltage to be applied to the sub deflector is increased in the case where the irradiation position is changed from the pattern 101 to the pattern 102. Thus, the voltage value largely changes. In the present embodiment, line widths (Lx, Ly) of the pattern 101 in the X and Y directions, written immediately before the irradiation position is changed from pattern 101 to pattern 102, is measured. When a voltage is applied to the sub deflector before the blanking start time, this will have an impact on the previously written pattern. When writing pattern 101, this impact can easily be comprehended because the change in the voltage is relatively large. Therefore, pattern 101 is selected to be measured.

Figure 5:
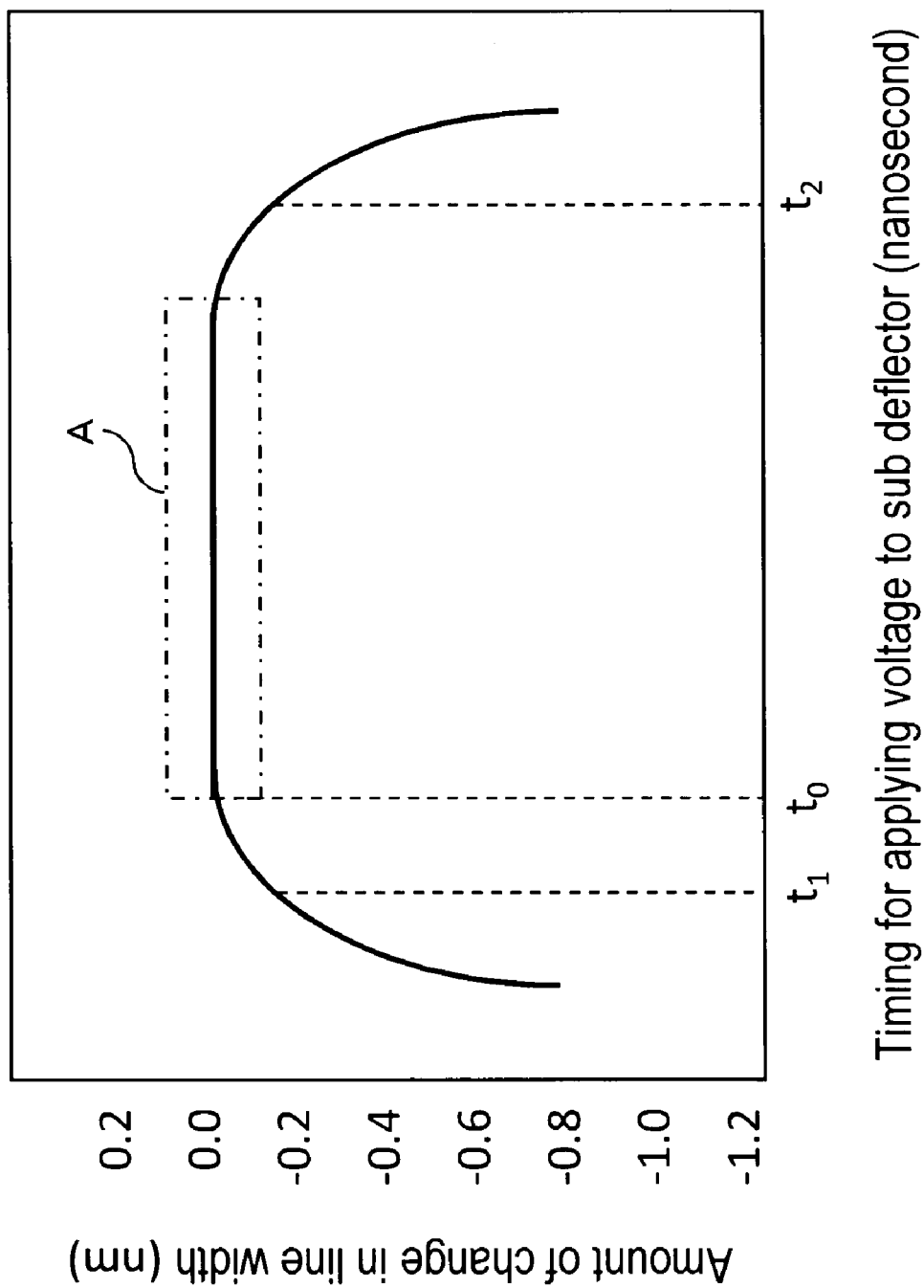
FIG. 5 is a graph showing the relationship between the timing for applying a voltage to a sub deflector and the amount of change in a line width of a pattern.

FIG. 5 is a graph showing an example of the relationship between the timing for applying voltage to the sub deflector and the amount of change in the line widths of the pattern. The timing for applying voltage to the sub deflector is plotted along the abscissa axis of the graph shown in FIG. 5. At Time $t_0$ shown in FIG. 5, the voltage starts to be applied to the sub deflector, and the blanking control signal starts to be input to the blanking deflector, simultaneously. The difference (shift amount) between the line widths of the pattern and target line widths is plotted along the ordinate axis of the graph shown in FIG. 5. The closer the shift amount is to zero, the closer the line widths of the pattern are to the target line width.

In FIG. 5, the shift amount is equal to zero at the time $t_0$. That is, when the start time for applying voltage to the sub deflector matches the time when the blanking control signal starts to be input to the blanking deflector, line widths equal to designed values can be obtained. However, the actual line widths of the pattern are not necessarily equal to the designed values since the line widths may vary due to process factors including a set dose and development/etching. A symbol A shown in FIG. 5 indicates a region in which sufficient accuracy of the pattern can be guaranteed. When the voltage is applied to the sub deflector at the time $t_0$, the shortest settling time can be set without degradation in the accuracy of the pattern.

At timing on the left side of the timing $t_0$ on the abscissa axis shown in FIG. 5, voltage is applied to the sub deflector before the blanking control signal is input to the blanking deflector. That is, the spot of the electron beam is moved from the pattern 101 to a region outside the pattern 101 during formation of the pattern 101. Due to the movement of the spot of the electron beam, a desirable irradiation amount of the electron beam may not be obtained for the formation of the pattern 101, and the line widths of the pattern 101 may be smaller than the designed values.

At timing on the right side of the timing $t_0$ on the abscissa axis shown in FIG. 5, voltage is applied to the sub deflector before the blanking termination time. Thus, the effective irradiation time is reduced, and the size of the pattern is also reduced. The further the timing for applying voltage is on the right side of the time $t_0$, the later voltage is applied. Therefore, the period of time (t) is longer. The period of time (t) is from the time when the blanking control signal starts to be input to the blanking deflector to the start time for applying voltage to the sub deflector. When the period of time t is excessively long, formation of the next pattern is started before the output of the sub deflector is stabilized. In this case, there is a tendency that the shift amount is large and the size of the pattern is small.

When the period of time t is excessively long, the period of time t has an impact on a line width of a pattern to be next written, i.e., the pattern 102. In this case, the period of time t also has an impact on the pattern 101. This results from the fact that since the timing for applying voltage to the sub deflector before the formation of the pattern 101 is delayed, the formation of the pattern 101 is started before the output of the sub deflector is stabilized. It appears that this effect leads to the fact that the shift amount is large when the timing for applying voltage to the sub deflector is on the right side of the time $t_2$ on the abscissa axis shown in FIG. 5. It should be noted that a similar effect to the above may occur on each of patterns other than a pattern initially written.

The timing for applying voltage to the sub deflector is determined from a timing range corresponding to the allowable range of the shift amount. The allowable range of the shift amount may be obtained based on demanded accuracy of the writing, and the timing range (corresponding to the obtained allowable range) for applying voltage to the sub deflector may be obtained based on the relationship shown in FIG. 5. For example, when the allowable range of the shift amount is set to a range of ±0.2 nm, the earliest timing is $t_1$ and the latest timing is $t_2$ in the example shown in FIG. 5. When the timing for applying voltage to the sub deflector is in a range of ($t_0-\Delta t' \leq t0 \leq t0+\Delta t$ ($\Delta t \geq 0$, $\Delta t' \geq 0$)), the line widths of the pattern, which are measured in the X and Y directions, are in the allowable range. In this case, the following expressions are established: $t0-\Delta t'=t_1$; and $t0+\Delta t=t_2$. The values $\Delta t$ and $\Delta t'$ are independently determined based on the allowable range of the shift amount. Although the expression of ($\Delta t > \Delta t'$) is established in the example shown in FIG. 5, the expression of ($\Delta t < \Delta t'$) or the expression of ($\Delta t = \Delta t'$) may be established depending on the case.

The abovementioned processing is performed by a timing control circuit 33. The timing control circuit 33 corresponds to timing control means according to the present invention.

Figure 6:
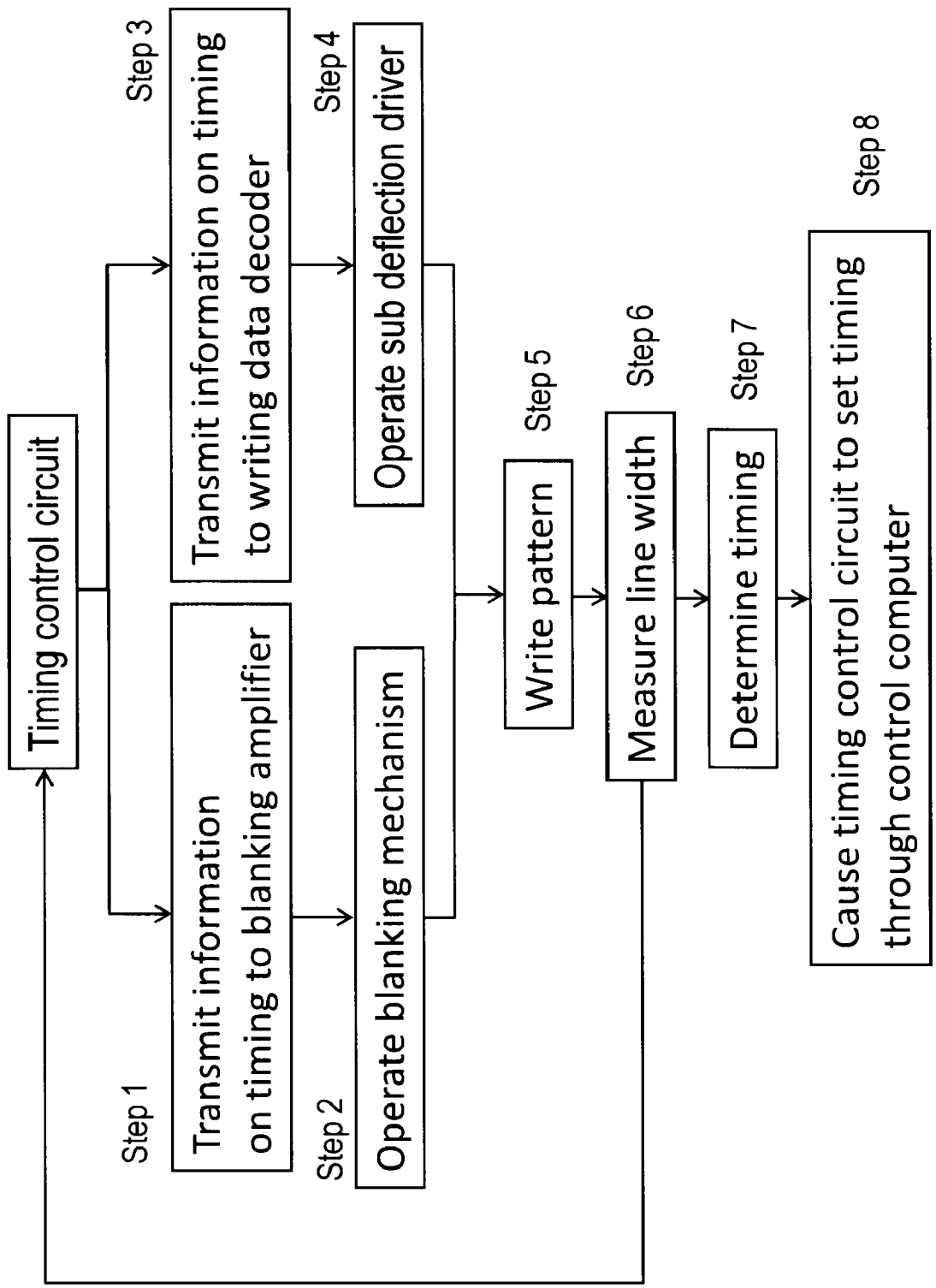
FIG. 6 is a flowchart of a process for determining the timing for applying voltage to the sub deflector.

Referring to FIG. 6, after the timing control circuit 33 selects a predetermined timing, the timing control circuit 33 transmits information on the predetermined timing to the blanking amplifier 25 in Step 1. The blanking mechanism is then operated at the specified timing in Step 2. In addition, in parallel with Step 1, the timing control circuit 33 transmits the information to the writing data decoder 24 in Step 3. The sub deflection amplifier 28 is operated at the specified timing in Step 4.

Voltage is applied to the sub deflector after a predetermined time elapses from the blanking start time or at the blanking start time by the operations in Steps 1 to 4. Next, writing is performed in Step 5 after the settling time elapses. This pattern writing is performed by using such a pattern mask as the evaluation pattern mask shown in FIG. 4.

After the writing of the patterns, the line widths of the patterns are measured by a measuring instrument (not shown) in Step 6.

The Steps 1 to 6 are repeatedly performed a predetermined number of times to obtain the relationship between the timing for applying voltage to the sub deflector and the amount of change in the line widths (as shown in FIG. 5). Then, appropriate timing for applying voltage to the sub deflector is obtained from the timing range corresponding to the allowable range of the shift amount in Step 7. It is preferable that Step 7 be performed by the control computer 20. Specifically, it is preferable that the control computer 20 receive data on the line widths obtained in Step 6 and compare target line widths and the line widths of the pattern written with the timing for applying voltage to the sub deflector changed, to determine appropriate timing for applying the voltage from the timing range corresponding to the predetermined allowable range of the difference between the target line widths and the measured line widths.

Then, the control computer 20 controls the timing control circuit 33 in Step 8 based on the timing determined in Step 7. Specifically, the control computer 20 transmits information on the timing to the timing control circuit 33. The timing control circuit 33 sets the timing for applying voltage to the sub deflector. It is preferable that the information on the timing obtained in Step 7 be stored in the magnetic disk 21 by the control computer 20 when necessary.

When the control computer 20 does not perform Step 7, the control computer 20 receives information on the timing determined from the timing range corresponding to the predetermined allowable range of the difference between the target line widths and the line widths of the patterns written with the timing for applying the voltage changed, and transmits the received information to the timing control circuit 33. It is preferable that the received information be stored in the magnetic disk 21 by the control computer 20.

In the present embodiment described above, appropriate timing for applying voltage to the sub deflector is determined based on the relationship between the timing for applying voltage to the sub deflector and the accuracy of writing. This makes it possible to reduce the period of time t (which is an overhead time) and improve the throughput without degradation in the accuracy of the writing.

The settling time according to the present embodiment can be specified by various methods. It is, however, preferable that the settling time be determined based on the movement distance of the irradiation position on a sample, that is, the amount of deflection of the electron beam. This results from the fact that since the settling time is closely related to the amount of deflection of the electron beam, it is possible to eliminate an unnecessary settling time and improve the throughput when the settling time is determined based on the amount of deflection of the electron beam. For example, the movement distance of the irradiation position based on writing data present in the subfield is calculated, and the settling time is determined based on the calculated distance.

When multiple overwriting is simply performed on the evaluation pattern (or when patterns are written without shifts of a deflection field), it is possible that the evaluation can be performed with a larger dimensional difference between the patterns due to the difference between the timings for applying voltage to the sub deflector. This results from the fact that the difference between the sizes of the patterns is increased since the time for one irradiation is reduced based on the number of times of the overwriting and the difference between the effective irradiation times is increased due to the difference between the timings. In the present embodiment, the multiple overwriting is performed four times to increase the difference between the sizes of the patterns and thereby obtain accurate timing.

The present invention is not limited to the abovementioned embodiment and may be modified without departing from the spirit and scope of the present invention. For example, although the electron beam is used in the abovementioned embodiment, the present invention is not limited to the electron beam. The present invention is applicable to the case where another charged-particle beam such as an ion beam is used.

In the present embodiment, the timing for applying voltage to the sub deflector is determined from the timing range corresponding to the predetermined allowable range of the difference between a predetermined line width and a line width of a pattern written immediately before the position of the spot of the electron beam on a sample is changed by a relatively large distance. The present invention, however, is not limited to the above. For example, the following operations may be performed: line widths of all patterns, each of which is written after the timing for applying voltage to the sub deflector is changed, are measured; the average of the measured line widths is compared with each of the measured line widths of the patterns; and appropriate timing for applying voltage to the sub deflector is determined based on a predetermined allowable range of the differences between a target line width and the measured line widths. According to this method, it seems that an impact on a pattern due to an excessively long time from the time when the blanking control signal starts to be input to the blanking deflector to the start time for applying voltage to the sub deflector is easily understood.

The features and advantages of the present invention may be summarized as follows.

According to a first aspect of the present invention, timing control means is provided to control the timing for applying a voltage to a sub deflector when changing the position to be irradiated with the charged particle beam. Therefore, a reduction in accuracy of writing can be suppressed, while the throughput can be improved.

According to a second aspect of the present invention, a pattern is written with the timing of applying a voltage to the sub deflector changed, and appropriate timing for applying voltage to the sub deflector is determined from a timing range corresponding to a predetermined allowable range of the difference between the line width of the written pattern and a target line width when moving a position to be irradiated with the charged-particle beam. Therefore, a reduction in accuracy of writing can be suppressed, while the throughput can be improved.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2007-255401, filed on Sep. 28, 2007 including specification, claims, drawings and summary, on which the Convention priority of the present application is based, are incorporated herein by reference in its entirety.

What is claimed is:

1. A charged-particle beam writing apparatus for controlling a charged-particle beam by means of a main deflector and a sub deflector which are provided on an optical path of the charged-particle beam, controlling a start time and termination time for irradiation with the charged-particle beam on a sample by means of a blanking deflector, to write a predetermined pattern onto the sample, comprising:
    timing control means for controlling the timing for applying a voltage to the sub deflector with respect to the termination time of the irradiation of the charged-particle beam onto the sample when changing a position to be irradiated with the charged-particle beam; and
    a control computer for controlling the timing control means.

2. The charged-particle beam writing apparatus according to claim 1, wherein
    the control computer has a function of recording the timing.

3. The charged-particle beam writing apparatus according to claim 1, wherein
    the control computer compares a line width of a pattern written with the timing of applying a voltage to the sub deflector changed and a predetermined line width, determines appropriate timing for applying voltage to the sub deflector from a timing range corresponding to a predetermined allowable range of a difference between the line width of the written pattern and the predetermined line width, and controls the timing control means based on the determined timing.

4. The charged-particle beam writing apparatus according to claim 1, wherein
    the timing is determined from a timing range corresponding to a predetermined allowable range of a difference between a target line width and a line width of a pattern written immediately before a position to be irradiated with the charged-particle beam is changed by a relatively large distance.

5. The charged-particle beam writing apparatus according to claim 1, wherein
    line widths of all patterns, each of which is written after the timing for applying voltage to the sub deflector is changed, are measured, the average of the measured line widths is compared with each of the measured line widths of the patterns, and the timing is determined based on a predetermined allowable range of differences between a target line width and the measured line widths.

6. The charged-particle beam writing apparatus according to claim 1, further comprising settling time determination means for determining a settling time based on a movement distance of the charged-particle beam irradiation position.

7. A charged-particle beam writing method in which a charged-particle beam is deflected by a main deflector and a sub deflector which are provided on the optical path of the charged-particle beam, and a predetermined pattern is written onto a sample placed on a stage, comprising
    the step of writing a pattern with timing of applying a voltage to the sub deflector changed with respect to a termination time for irradiation of the charged-particle beam, and determining, when moving a position to be irradiated with the charged-particle beam, appropriate timing for applying voltage to the sub deflector from a timing range corresponding to a predetermined allowable range of a difference between the line width of the written pattern and a target line width.

8. The charged-particle beam writing method according to claim 7, wherein
    the timing is determined from a timing range corresponding to an allowable range of a difference between a target line width and a line width of a pattern written immediately before the position to be irradiated with the charged-particle beam is changed by a relatively large distance.

9. The charged-particle beam writing method according to claim 7, further comprising the step of determining a settling time based on a movement distance of the charged-particle beam irradiation position.

* * * * *